United States Patent
Huang et al.

(10) Patent No.: US 9,897,676 B2
(45) Date of Patent: Feb. 20, 2018

(54) RADIO FREQUENCY EXCITATION METHOD AND DEVICE FOR MAGNETIC RESONANCE IMAGING SYSTEM

(71) Applicants: Yu Qing Huang, Shenzhen (CN); Cong Zhao, Shenzhen (CN)

(72) Inventors: Yu Qing Huang, Shenzhen (CN); Cong Zhao, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 1007 days.

(21) Appl. No.: 14/221,614

(22) Filed: Mar. 21, 2014

(65) Prior Publication Data

US 2014/0285193 A1 Sep. 25, 2014

(30) Foreign Application Priority Data

Mar. 22, 2013 (CN) .......................... 2013 1 0096478

(51) Int. Cl.
*G01R 33/483* (2006.01)
*G01R 33/563* (2006.01)
*G01R 33/561* (2006.01)

(52) U.S. Cl.
CPC ... *G01R 33/4833* (2013.01); *G01R 33/56341* (2013.01); *G01R 33/5616* (2013.01)

(58) Field of Classification Search
CPC ............ G01R 33/4833; G01R 33/5616; G01R 33/56341
See application file for complete search history.

(56) References Cited

U.S. PATENT DOCUMENTS

| | | | | |
|---|---|---|---|---|
| 4,651,097 A | * | 3/1987 | Iwaoka ................ | G01R 33/482 324/307 |
| 4,734,646 A | * | 3/1988 | Shenoy .................. | G01R 33/56 324/309 |
| 4,777,439 A | * | 10/1988 | Granot ............... | G01R 33/4833 324/309 |
| 4,891,595 A | * | 1/1990 | Granot .................. | G01R 33/56 324/307 |
| 5,111,144 A | * | 5/1992 | Kuhn .................. | G01R 33/561 324/307 |
| 5,296,809 A | * | 3/1994 | Roberts .............. | G01R 33/4838 324/309 |

(Continued)

FOREIGN PATENT DOCUMENTS

JP 2001-231763 8/2001

*Primary Examiner* — Dixomara Vargas
(74) *Attorney, Agent, or Firm* — Schiff Hardin LLP

(57) ABSTRACT

In an RF excitation method and device for a magnetic resonance imaging system, the RF pulses are emitted in a STEAM sequence, the STEAM sequence including, in time order, a first 90-degree excitation pulse, a second 90-degree excitation pulse and a third 90-degree excitation pulse. Gradient pulses are activated that act in cooperation with the STEAM sequence, the gradient pulses including, in time order, a first gradient pulse, a second gradient pulse and a third gradient pulse. Each of the gradient pulses is activated simultaneously with the corresponding RF pulse. The direction of each of the gradient pulses is the vector sum of multiple gradient pulses in different directions, the directions of any two of the gradient pulses being the same and intersecting with the direction of another of the gradient pulses.

12 Claims, 6 Drawing Sheets

(56) References Cited

U.S. PATENT DOCUMENTS

| | | | | |
|---|---|---|---|---|
| 5,374,889 A * | 12/1994 | Leach | G01R 33/4833 | 324/307 |
| 5,391,990 A * | 2/1995 | Schmitt | G01R 33/3875 | 324/319 |
| 5,412,321 A * | 5/1995 | Kohno | G01R 33/5615 | 324/300 |
| 5,541,511 A * | 7/1996 | Hennig | G01R 33/5615 | 324/309 |
| 5,615,676 A * | 4/1997 | Kohno | G01R 33/5615 | 324/307 |
| 5,798,643 A * | 8/1998 | Werthner | G01R 33/482 | 324/309 |
| 6,696,889 B2 * | 2/2004 | Watanabe | G01R 33/4608 | 329/309 |
| 6,794,870 B2 * | 9/2004 | Hennig | G01R 33/5613 | 324/307 |
| 6,891,373 B2 * | 5/2005 | Deimling | G01R 33/56341 | 324/307 |
| 7,514,927 B2 * | 4/2009 | Herzka | G01R 33/4835 | 324/309 |
| 7,541,809 B2 * | 6/2009 | Miyoshi | A61B 5/055 | 324/306 |
| 7,725,156 B2 * | 5/2010 | Deimling | G01R 33/4816 | 324/309 |
| 7,772,844 B2 | 8/2010 | Hurd | | |
| 8,032,335 B2 * | 10/2011 | Martin | G01N 24/08 | 324/300 |
| 8,067,936 B2 * | 11/2011 | Garwood | G01N 24/10 | 324/307 |
| 8,547,101 B2 * | 10/2013 | Hirata | G01R 33/4833 | 324/318 |
| 8,698,496 B2 * | 4/2014 | Sorensen | G01R 33/4633 | 324/307 |
| 9,035,650 B2 * | 5/2015 | Popescu | G01R 33/4835 | 324/307 |
| 9,123,121 B2 * | 9/2015 | Nishihara | A61B 5/055 | |
| 9,335,395 B2 * | 5/2016 | De Oliveira | G01R 33/583 | |
| 9,513,358 B2 * | 12/2016 | Levin | G01R 33/56509 | |
| 2008/0116889 A1 | 5/2008 | Hu et al. | | |

* cited by examiner

RADIO FREQUENCY EXCITATION METHOD AND DEVICE FOR MAGNETIC RESONANCE IMAGING SYSTEM

BACKGROUND OF THE INVENTION

Field of the Invention

The present invention concerns magnetic resonance imaging systems, in particular to an excitation method and device for magnetic resonance imaging.

Description of the Prior Art

Magnetic resonance imaging (MRI) is a technology in which the phenomenon of magnetic resonance is utilized for the purpose of imaging. With reference to the conventional MRI data acquisition unit 1 shown in FIG. 5, the main principles of magnetic resonance are as follows: when an atomic nucleus contains a single proton, as is the case for example with the nuclei of the hydrogen atoms that are present throughout the human body, this proton exhibits spin motion and resembles a small magnet. Moreover, the spin axes of these small magnets lack a definite pattern, and when an external magnetic field is applied to a subject situated in an opening 3 of a basic field magnet 2, the small magnets will be rearranged according to the magnetic force lines of the external field. Specifically, they will align in two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis. The atomic nuclei only have a longitudinal magnetization component, which has both a direction and a magnitude. A radio frequency (RF) pulse of a specific frequency, radiated by an RF antenna 4, is used to excite the atomic nuclei in the external magnetic field such that their spin axes deviate from the positive longitudinal axis or negative longitudinal axis, giving rise to resonance—this being the phenomenon of magnetic resonance. Once the spin axes of the excited atomic nuclei have deviated from the positive or negative longitudinal axis, the atomic nuclei have a transverse magnetization component. Once emission of the RF pulse has ended, the excited atomic nucleus emits an echo signal, gradually releasing the absorbed energy in the form of electromagnetic waves, such that its phase and energy level both return to the pre-excitation state. An image can be reconstructed by subjecting the echo signal emitted by atomic nuclei to further processing, such as spatial encoding with a gradient system 5. Control and reconstruction are implemented by a computer 6.

In MRI, when three or more RF pulses are applied in succession, a stimulated echo (STimulated-Echo, STE) will arise, the strength of the echo produced being less than that of the spin echo. Since the stimulated echo is formed by a rephasing echo of an RF pulse, the resulting STEAM (STimulated-Echo Acquisition Mode, STEAM) sequence is already in routine use.

In magnetic resonance imaging of the heart in the prior art, the RF pulses of the STEAM sequence consist of three 90-degree excitation pulses, applied one after the other to the examination subject in conjunction with orthogonal gradients, so that a stimulated echo (STimulated-Echo, STE) signal is generated in one voxel at the intersection of three slices. The first 90-degree excitation pulse acts in cooperation with the slice selection gradient, exciting all nuclear protons in the selected slice; after a time interval of TE/2, the second 90-degree excitation pulse rotates the magnetization vector lying in the XY-plane so that it lies in the XZ-plane; the third 90-degree excitation pulse rotates all the nuclear protons into the XY-plane, and after another time interval of TE/2, the phases reconverge to form an echo.

In the human body, the structure of the myocardium is closely related to heart function, and undergoes a marked change in the event of a pathological change. It has already been demonstrated that data from DT-MRI (Diffusion Tensor-Magnetic Resonance Imaging) is vector image data, which can be used to draw the structure of a living myocardium. DT-MRI is obtained from multiple DW-MRI (Diffusion Weighted-Magnetic Resonance Imaging) data, wherein DW-MRI is scalar data in various directions.

A composite DT-MRI and STEAM mode, with a DW (diffusion weighted) STEAM (STimulated-Echo Acquisition Mode, spatially localized stimulated echo acquisition sequence) EPI (Echo Planar Imaging) sequence has been developed for use in heart imaging. Multiple DW STEAM EPI sequences constitute a single DT STEAM EPI imaging operation. When an existing heart DT (diffusion tensor, generally used for neuroimaging, in which the orientation of fibers is determined on the basis of the direction of Brownian motion of water molecules) STEAM EPI sequence is used, the imaging area (FoV) must be adjusted in the phase gradient direction to a size capable of including the entire thoracic cavity, and since the space occupied by the heart in the thoracic cavity is quite small, this imaging area is much larger in size than the target tissue (heart). This results in the echo sequence being longer and the gradient labeling time read out by the EPI readout module being shorter, in turn leading to the echo time being longer and image deformation caused by susceptibility effects in the final image being stronger.

As described above, the DT STEAM EPI excitation method is the most commonly used heart diffusion tensor imaging method. In general, two diffusion-encoding gradients (DG, Diffusion Gradient) are used in DWI. As regards the STEAM mode, these two diffusion-encoding gradients are set at the same phase delay point in successive heart rate cycles, so as to reduce sensitivity to large heart rate movements. As well as heart rate movement, respiratory movement is another challenge to heart DTI measurement. For current heart DTI sequences, there are two ways of solving this problem: holding the breath, or breathing freely with the assistance of a breathing guide device. As regards existing heart DW STEAM EPI sequences, the imaging area is dependent on the size of the target object in the direction of the phase gradient, and cannot be reduced owing to the phenomenon of aliasing, but the visual field read out is by no means limited to the target size.

Furthermore, the heart structure occupies only a very small part of a heart image, but the imaging area chosen in the prior art must cover the size of the entire thoracic cavity in the phase gradient direction. A relatively large imaging area might not be a problem in other imaging technologies, but in the case of sequences for which an EPI readout module is used, the result is a longer echo line and a shorter gradient peak time. This situation is even more serious in the case of heart DT STEAM EPI sequences, owing to the effects of heartbeat and respiratory movement. Thus, the phase resolution point is generally set to be very small to avoid the effects of a long echo time and susceptibility effects during heart DTI measurement, despite the fact that such a measure sacrifices spatial resolution. However, imaging quality still suffers the full effects of these factors.

It is clear that when an existing heart DW STEAM EPI sequence is used, a relatively low spatial resolution and image deformation are unavoidable, the result being imprecise DTI calculation and myocardium fiber reproduction. Thus a method for reducing the imaging area to improve the performance of heart DW STEAM EPI is needed. It has already been demonstrated that a two-dimensional RF excitation pulse based on an echo plane gradient track is one effective technology for reducing the imaging area and improving image quality. However, since a relatively long 2D RF duration causes echo times to be universally lengthened, this technology is not suitable for existing heart DW STEAM EPI sequences.

SUMMARY OF THE INVENTION

In response to the above technical problem, an object of the embodiments of the present invention is to provide an RF excitation method for an MRI system, comprising: emitting RF pulses, the RF pulses being a STEAM sequence, the STEAM sequence comprising in time order: a first 90-degree excitation pulse, a second 90-degree excitation pulse and a third 90-degree excitation pulse; emitting gradient pulses which act in cooperation with the STEAM sequence, the gradient pulses comprising in time order: a first gradient pulse, a second gradient pulse and a third gradient pulse, wherein each of the gradient pulses proceeds simultaneously with the corresponding RF pulse, wherein the direction of each of the gradient pulses is the vector sum of multiple gradient pulses in different directions, the directions of any two of the gradient pulses being the same and intersecting with the direction of another of the gradient pulses.

In an embodiment of the present invention, the directions of the second gradient pulse and the third gradient pulse are the same and intersect with the direction of the first gradient pulse.

In an embodiment of the present invention, the directions of the second gradient pulse and the first gradient pulse are the same and intersect with the direction of the third gradient pulse.

In an embodiment of the present invention, the directions of the first gradient pulse and the third gradient pulse are the same and intersect with the direction of the second gradient pulse.

In an embodiment of the present invention, the directions of any two of the gradient pulses are the same and are orthogonal to the direction of another of the gradient pulses.

In an embodiment of the present invention, the STEAM sequence is a DW STEAM EPI sequence.

Another object of the embodiments of the present invention is to provide an RF excitation device for a sequence of an MRI system, comprising: an emitter of RF pulses, the RF pulses being a STEAM sequence, the STEAM sequence comprising in time order: a first 90-degree excitation pulse, a second 90-degree excitation pulse and a third 90-degree excitation pulse; an emitter of gradient pulses, the gradient pulses acting in cooperation with the STEAM sequence and comprising in time order: a first gradient pulse, a second gradient pulse and a third gradient pulse, wherein each of the gradient pulses proceeds simultaneously with the corresponding RF pulse, wherein the direction of each of the gradient pulses is the vector sum of multiple gradient pulses in different directions, the directions of any two of the gradient pulses being the same and intersecting with the direction of another of the gradient pulses.

In an embodiment of the present invention, the directions of the second gradient pulse and the third gradient pulse are the same and intersect with the direction of the first gradient pulse.

In an embodiment of the present invention, the directions of the second gradient pulse and the first gradient pulse are the same and intersect with the direction of the third gradient pulse.

In an embodiment of the present invention, the directions of the first gradient pulse and the third gradient pulse are the same and intersect with the direction of the second gradient pulse.

In an embodiment of the present invention, the directions of any two of the gradient pulses are the same and are orthogonal to the direction of another of the gradient pulses.

In an embodiment of the present invention, the STEAM sequence is a DW STEAM EPI sequence.

Another object of the embodiments of the present invention is to provide an MRI system, comprising any one of the above RF excitation devices.

It can be seen that the RF method and device of the MRI system according to particular embodiments of the present invention are distinguished by easy operation, high efficiency and good expandability.

DESCRIPTION OF THE PREFERRED EMBODIMENTS

Embodiments of the present invention are illustrated in further detail below as examples to explain the object, technical solution and advantages thereof.

To solve the problems presented in the background art section, as stated above, since the imaging region of an existing heart DW STEAM EPI sequence is dependent on the size of the target object along the phase gradient, and owing to the phenomenon of phase distortion, the imaging region cannot be reduced, but the field of view that is read out is by no means limited to the target size. For this situation, the present invention proposes the following particular embodiment.

The present invention is an excitation method for a sequence of an MRI system, wherein RF pulses are emitted as a STEAM sequence. The STEAM sequence implies in time order, a first 90-degree excitation pulse, a second 90-degree excitation pulse and a third 90-degree excitation pulse. Gradient pulses are activated that act in cooperation with the STEAM sequence. The gradient pulses include in time order, a first gradient pulse, a second gradient pulse and a third gradient pulse, each of the gradient pulses being activated simultaneously with the corresponding RF pulse. The direction of each of the gradient pulses is the vector sum of multiple gradient pulses in different directions, the directions of any two of the gradient pulses being identical and intersecting with the direction of another of the gradient pulses.

An embodiment of the present invention concerns an excitation method for a heart DT STEAM EPI sequence, the method having a relatively small imaging region. Such an excitation method is suitable for a current heart DT STEAM EPI sequence, and reduces the size of the excitation area in the phase encoding direction. At the same time, the method is also capable of shortening the echo sequence, and extending the labeling time without affecting the initial sequence structure and function. Furthermore, the imaging area can be freely selected, the result of this excitation method being improved quality of heart diffusion imaging and the provision of more precise diffusion weighted imaging (DWI) data for heart DTI calculation. The excitation method is similarly suitable for other STEAM sequences, such as independent STEAM sequences without added diffusion gradients.

Figure 1:
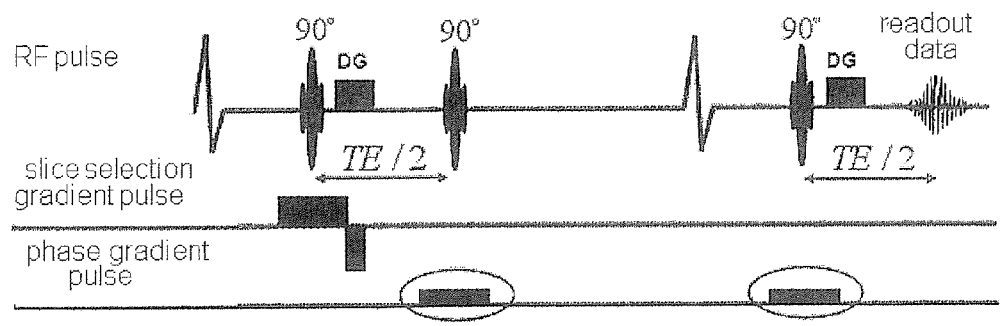
FIG. 1 is a schematic diagram of a heart DW STEAM EPI sequence according to a particular embodiment of the present invention.
Figure 5:
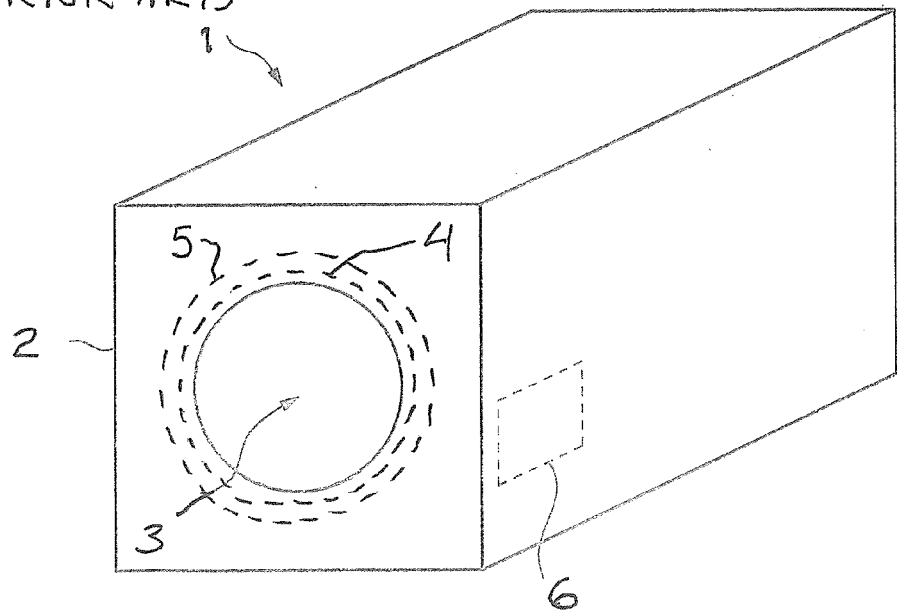
FIG. 5, as noted above, schematically illustrates the basic components of a conventional MRI data acquisition unit.

FIG. 1 is a schematic diagram of a heart DTI STEAM EPI sequence according to a particular embodiment of the present invention. Irrespective of whether the paused breathing mode or the guided breathing mode is employed, the particular embodiments of the present invention amend the existing sequence to achieve the objective of reducing the imaging area in the phase direction.

As FIG. 1 shows, the two gradient pulses which act in cooperation with the second 90-degree excitation pulse and the third 90-degree excitation pulse are in the same direction, both being slice selection gradients; at the same time, one of the gradient pulses acting in cooperation with the first 90-degree excitation pulse is orthogonal to the slice selection gradients, being a phase gradient. Specifically, the heart DTI STEAM EPI sequence according to a particular embodiment of the present invention is formed of three 90-degree excitation pulses, wherein the first 90-degree excitation pulse acts in cooperation with a slice selection gradient, exciting all nuclear protons in a selected slice; the second 90-degree excitation pulse acts in cooperation with a phase gradient, the magnetization vector lying in the XY-plane being rotated into the YZ-plane; the third 90-degree excitation pulse acts in cooperation with a phase gradient, causing all the nuclear protons to be rotated into the XY-plane, and after another time interval of TE/2, the phases reconverge to form an echo.

By the same principle, the heart DTI STEAM EPI sequence according to a particular embodiment of the present invention can also be realized in the following ways: the directions of two gradient pulses emitted in coordination with the first 90-degree excitation pulse and the third 90-degree excitation pulse, respectively, are the same and orthogonal to the direction of one gradient pulse emitted in coordination with the second 90-degree excitation pulse; alternatively, the directions of two gradient pulses emitted in coordination with the first 90-degree excitation pulse and the second 90-degree excitation pulse, respectively, are the same and orthogonal to the direction of one gradient pulse emitted in coordination with the third 90-degree excitation pulse. The three embodiments described above can obtain the same image data acquired by STEAM mode, the only difference being the order in which the image data is acquired.

Figure 2:
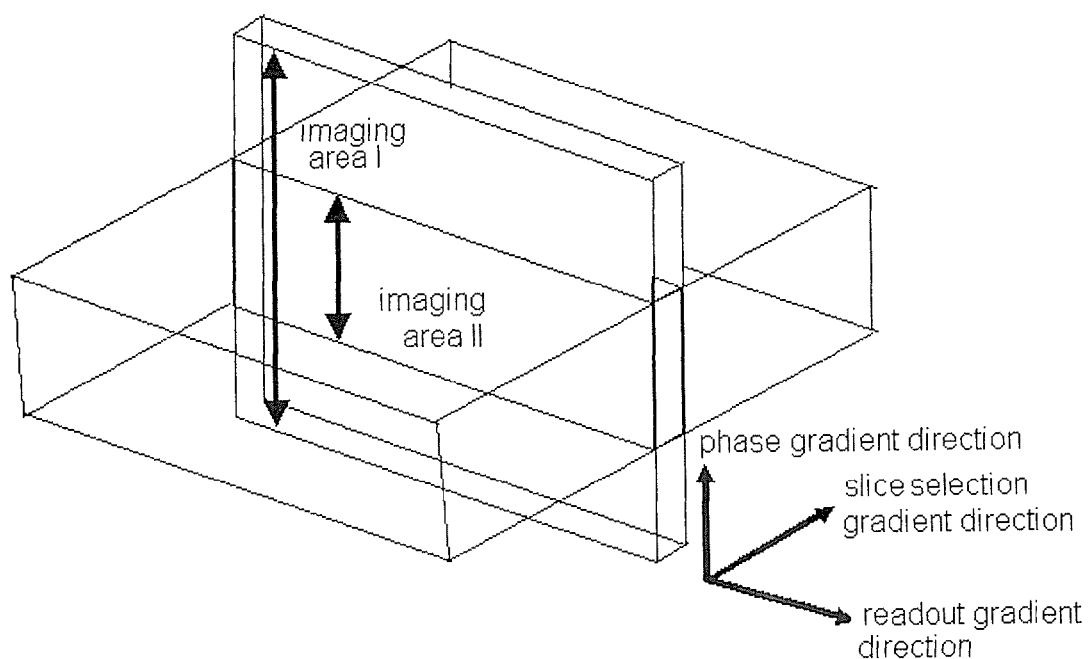
FIG. 2 is a schematic diagram of an imaging area of a heart DW STEAM EPI sequence according to a particular embodiment of the present invention.

For the imaging area of the heart DT STEAM EPI sequence according to a particular embodiment of the present invention, as shown in FIG. 2, since the direction of one gradient pulse emitted in coordination with the first 90-degree excitation pulse is orthogonal to the directions of two gradient pulses emitted in coordination with the following two 90-degree excitation pulses, respectively, only the region of intersection is selected, like imaging area II in FIG. 2. FIG. 2 is a schematic diagram of an imaging area of a heart DT STEAM EPI sequence according to a particular embodiment of the present invention. By adopting a particular embodiment according to the present invention, the imaging area in the phase gradient direction can be manually altered, specifically by altering the gradient pulses corresponding to the second 90-degree excitation pulse and the third 90-degree excitation pulse, i.e. the size of the phase gradients.

As FIG. 2 shows, the imaging area generated by a heart DT STEAM EPI sequence in the prior art is imaging area I; the imaging area generated by the heart DT STEAM EPI sequence according to a particular embodiment of the present invention is imaging area II. It can be seen therefrom that when the heart DT STEAM EPI sequence according to a particular embodiment of the present invention is tested in heart DTI measurement, the reduced imaging area is set to a size adapted to the heart, while the echo time is correspondingly shortened and the effect of susceptibility is correspondingly reduced, increasing the spatial resolution of the final image. Since the excitation method for a heart DT STEAM EPI sequence according to a particular embodiment of the present invention is integrated in a heart DT STEAM EPI sequence from the prior art as an excitation option for the heart DT STEAM EPI sequence, the structure and function of the heart DT STEAM EPI sequence do not change at all.

Figure 3:
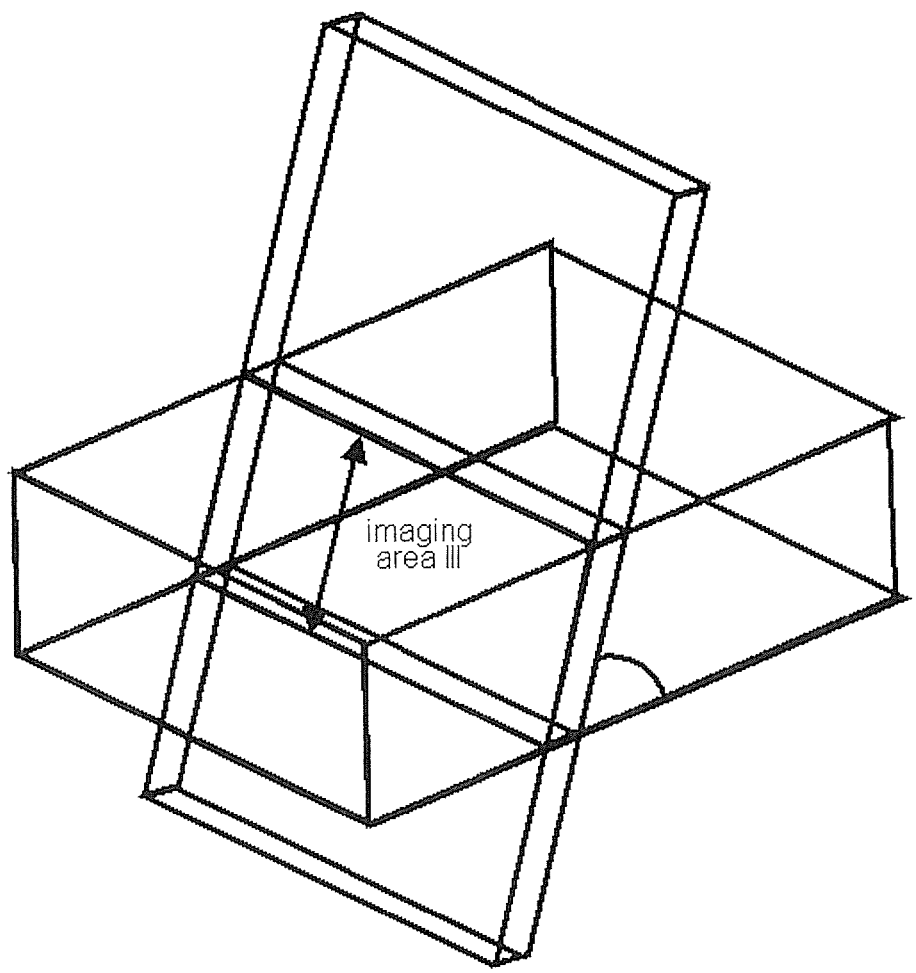
FIG. 3 is a schematic diagram of an imaging area of a heart DW STEAM EPI sequence according to a particular embodiment of the present invention.

In addition, FIG. 3 is a schematic diagram of an imaging area of a heart DT STEAM EPI sequence according to a particular embodiment of the present invention. For the imaging area of the heart DT STEAM EPI sequence according to a particular embodiment of the present invention, as shown in FIG. 3, an alternative to orthogonality is that the direction of one gradient pulse emitted in coordination with the first 90-degree excitation pulse may form another angle with the directions of the two gradient pulses emitted in coordination with the following two 90-degree excitation pulses, respectively. By the same principle, only the region of intersection is selected, like imaging area III in FIG. 3. The gradient pulse is a vector, therefore the direction of the gradient pulse is the vector sum of multiple gradient pulses in different directions; for example, by vector-summing a 3 mT/M gradient pulse on the X-axis with a 4 mT/M gradient pulse on the Y-axis, a 5 mT/M gradient pulse in the XY-plane which makes an angle of 60 degrees with the X-axis (30 degrees with the Y-axis) is obtained.

The excitation method for a heart DT STEAM EPI sequence according to a particular embodiment of the present invention is a simple and effective method capable of markedly improving heart DTI quality. Specifically, amending the excitation mode of existing heart DT STEAM EPI allows a smaller imaging region to be adopted for heart DTI measurement, and heart DTI quality to be thereby improved, while more precise DTI data can also be provided for heart DTI calculation. Thus the excitation method for a heart DT STEAM EPI sequence according to a particular embodiment of the present invention has the following advantages:

1. Easy Operation

The excitation method for a heart DT STEAM EPI sequence according to a particular embodiment of the present invention will not present other difficulties to or impose other restrictions on the heart DT STEAM EPI sequence, as it only amends the excitation pulse direction. The excitation method for a heart DT STEAM EPI sequence according to a particular embodiment of the present invention is integrated in a heart DT STEAM EPI sequence as an excitation option for the heart DW STEAM EPI sequence, so the structure and function of the heart DT STEAM EPI sequence do not change at all. Similar DTI result data can be reconstructed by data preprocessing.

2. High Efficiency

The target area of the excitation method for a heart DT STEAM EPI sequence according to a particular embodiment of the present invention can be accurately selected by choosing an imaging area appropriately, thereby obtaining a shorter echo time and higher spatial resolution and reducing the effect of susceptibility on heart DTI measurement.

3. Good Expandability

The excitation method for a heart DT STEAM EPI sequence according to a particular embodiment of the present invention is also suitable for other sequences employing the STEAM mode.

Comparative measurements were made for a full body scan of a healthy volunteer in a 3T MRI system equipped with 12 array coils, based on a heart DW STEAM EPI sequence from the prior art and a heart DW STEAM EPI sequence according to a particular embodiment of the present invention. Two sequences were used in the test: a heart DW STEAM EPI sequence from the prior art and a heart DW STEAM EPI sequence according to a particular embodiment of the present invention. For the heart DW STEAM EPI sequence from the prior art, imaging area× readout field of view=320×320 mm, echo train length is 128, echo time is 35 ms, spatial resolution is 3.0×3.0×7 mm$^3$. For the heart DW STEAM EPI sequence according to a particular embodiment of the present invention, imaging area× readout field of view=320×136 mm, echo train length is 52, echo time is 26 ms, spatial resolution is 2.1×2.1×7 mm$^3$, and gradient labeling time is increased by about 2.4 times compared to the original heart DTI STEAM EPI sequence. The other parameters of the two sequences are the same.

Figure 4A:
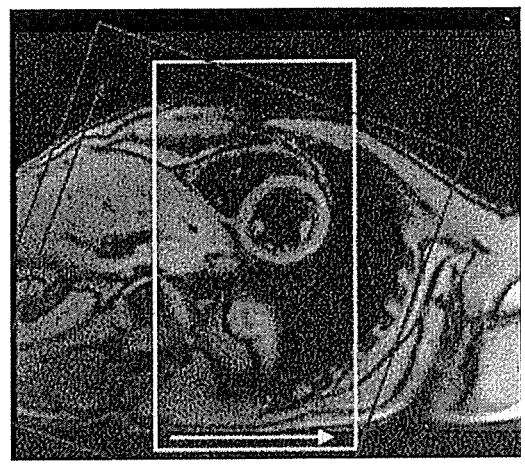
FIG. 4a is a partial view for the case where a heart DW STEAM EPI sequence according to a particular embodiment of the present invention is used with a minor-axis field of view.

FIGS. 4a-4e are the volunteer test results for the two sequences. FIG. 4a is a partial view for the case where a heart DTI STEAM EPI sequence according to a particular embodiment of the present invention is used with a minor-axis field of view. For the excitation method for the heart DT STEAM EPI sequence from the prior art, the full imaging area shown by the wider rectangle in FIG. 4a is used; the arrow in the wider rectangle is the phase encoding direction, and the imaging area should include the entire extent of the thoracic cavity in the phase direction. For the excitation method for the heart DT STEAM EPI sequence according to the present invention, the reduced imaging area shown by the narrower rectangle in the figure is used. The arrow in the narrower rectangle is the phase encoding direction; a suitable imaging area has simply been used in the phase direction.

Figure 4B:
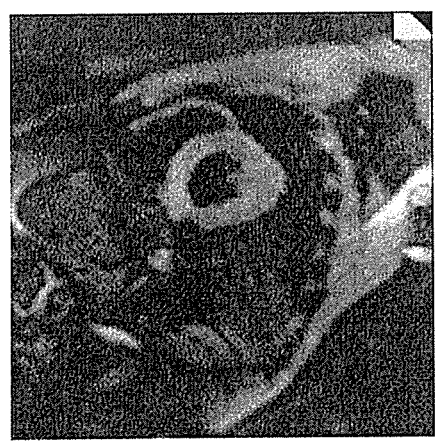
FIG. 4b is a two-dimensional diffusion weighted image for the case where a heart DW STEAM EPI sequence from the prior art is used with a full field of view.
Figure 4C:
FIG. 4c is a two-dimensional diffusion weighted image for the case where a heart DW STEAM EPI sequence according to a particular embodiment of the present invention is used.
Figure 4D:
FIG. 4d is a two-dimensional tracking diffusion weighted image for the case where a heart DW STEAM EPI sequence according to a particular embodiment of the present invention is used.
Figure 4E:
FIG. 4e is a two-dimensional color fractional anisotropy (FA) image for the case where a heart DW STEAM EPI sequence according to a particular embodiment of the present invention is used.

FIG. 4b is a two-dimensional diffusion weighted image for the case where an excitation method for a heart DTI STEAM EPI sequence from the prior art is used with a full field of view. FIGS. 4c to 4e are results images produced when the excitation method for a DTI STEAM EPI sequence according to a particular embodiment of the present invention is used. FIG. 4c is a two-dimensional diffusion weighted image for the case where a heart DTI STEAM EPI sequence according to a particular embodiment of the present invention is used; FIG. 4d is a two-dimensional tracking diffusion weighted image for the case where a heart DTI STEAM EPI sequence according to a particular embodiment of the present invention is used; FIG. 4e is a two-dimensional color fractional anisotropy image for the case where a heart DTI STEAM EPI sequence according to a particular embodiment of the present invention is used. Compared to FIG. 4b, FIG. 4c shows a clear improvement in terms of image deformation caused by the effect of susceptibility, while the spatial resolution is also markedly improved without a major loss in the signal-to-noise ratio; although the myocardium of the right ventricle is relatively thin, the structure thereof can still be clearly seen in FIG. 4c. The two-dimensional FA image in FIG. 4e is obtained by subjecting DWI data to DTI calculation; different colors are used in FIG. 4e to represent fiber directions in the myocardium. It can be seen from FIG. 4e that the fiber direction of the subepicardial myocardium is mostly somewhat different from the direction of the subendocardial myocardium, which is the same as the basic myocardial fiber direction.

The embodiments described above are merely preferred embodiments of the present invention, and are by no means intended to define the scope of protection thereof. Suitable improvements could be made to the preferred embodiments according to the present invention in the course of specific implementation, to suit particular requirements of particular situations. Therefore it should be appreciated that the particular embodiments of the present invention described herein serve a demonstrative purpose only, and are by no means intended to limit the scope of protection of the present invention.

Although modifications and changes may be suggested by those skilled in the art, it is the intention of the inventors to embody within the patent warranted hereon all changes and modifications as reasonably and properly come within the scope of their contribution to the art.

I claim:

1. A method for acquiring magnetic resonance (MR) image data, comprising:
   operating a radio-frequency (RF) radiator of an MR data acquisition unit to radiate RF pulses in a STEAM (Stimulated Echo Acquisition Mode) imaging sequence, said RF pulses comprising, in chronological order, a first 90° excitation pulse, a second 90° excitation pulse, and a third 90° excitation pulse, each of which excites nuclear spins in an examination subject situated in the MR data acquisition unit;
   operating a gradient system of the MR data acquisition unit to activate gradient pulses in synchronization with, and as an addition to, said STEAM imaging sequence, said gradient pulses comprising, in chronological order, a first gradient pulse, a second gradient and a third gradient pulse, said first, second and third gradient pulses being respectively simultaneously with said first, second and third 90° RF excitation pulses;

operating said gradient system of said MR data acquisition unit to activate said first, second and third gradient pulses non-orthogonally with a respective direction of each of said first, second and third gradient pulses being a vector sum of multiple gradient pulses in different directions, with respective directions of any two of said gradient pulses being identical and intersecting with the direction of another of said gradient pulses, in order to reduce said imaging area compared to an imaging area produced by said STEAM imaging sequence without said addition; and operating said MR data acquisition unit to acquire MR data resulting from the excited nuclear spins, transforming the acquired MR data into image data, and making the acquired MR image data available at an output of the MR data acquisition unit as an electronic signal.

2. A method as claimed in claim 1 comprising operating said gradient system of said MR data acquisition unit to activate said second gradient pulse and third gradient pulse in directions that are identical and that intersect with the direction of the first gradient pulse.

3. A method as claimed in claim 1 comprising operating the gradient system of said MR data acquisition unit to activate said second gradient pulse and said first gradient pulse in identical directions that intersect with the direction of the third gradient pulse.

4. A method as claimed in claim 1 comprising operating the gradient system of the MR data acquisition unit to activate the first gradient pulse and the third gradient pulse in identical directions that intersect with the direction of the second gradient pulse.

5. A method as claimed in claim 1 comprising operating the gradient system of the MR data acquisition unit to activate the first, second and third gradient pulses with respective directions of any two of said first, second and third gradient pulses being identical and orthogonal to the direction of another of the first, second and third gradient pulses.

6. A method as claimed in claim 1 comprising operating said RF radiator of said MR data acquisition unit with said STEAM imaging sequence as a DW STEAM EPI sequence.

7. A magnetic resonance (MR) apparatus comprising:
an MR data acquisition unit, in which an examination subject is situated, said MR data acquisition unit comprising a radio-frequency (RF) radiator and a gradient system;
a control unit configured to operate the RF radiator to radiate RF pulses in a STEAM (Stimulated Echo Acquisition Mode) imaging sequence, said RF pulses comprising, in chronological order, a first 90° excitation pulse, a second 90° excitation pulse, and a third 90° excitation pulse, each of which excites nuclear spins in the examination subject situated in the MR data acquisition unit;

said control unit being configured to operate the gradient system to activate gradient pulses in synchronization with, and as an addition to, said STEAM imaging sequence, said gradient pulses comprising, in chronological order, a first gradient pulse, a second gradient and a third gradient pulse, said first, second and third gradient pulses being respectively simultaneously with said first, second and third 90° RF excitation pulses;

said control unit being configured to operate the gradient system to activate said first, second and third gradient pulses non-orthogonally with a respective direction of each of said first, second and third gradient pulses being a vector sum of multiple gradient pulses in different directions, with respective directions of any two of said gradient pulses being identical and intersecting with the direction of another of said gradient pulses, in order to reduce said imaging area compared to an imaging area produced by said STEAM imaging sequence without said addition; and said control unit being configured to operate said MR data acquisition unit to acquire MR image data resulting from the excited nuclear spins, transforming the acquired MR data into image data, and to make the image data available at an output of the MR data acquisition unit as an electronic signal.

8. An MR system as claimed in claim 7, wherein said control unit is configured to operate said gradient system of said MR data acquisition unit to activate said second gradient pulse and third gradient pulse in directions that are identical and that intersect with the direction of the first gradient pulse.

9. An MR system as claimed in claim 8, wherein said control unit is configured to operate the gradient system of said MR data acquisition unit to activate said second gradient pulse and said first gradient pulse in identical directions that intersect with the direction of the third gradient pulse.

10. An MR system as claimed in claim 8, wherein said control unit is configured to operate the gradient system of the MR data acquisition unit to activate the first gradient pulse and the third gradient pulse in identical directions that intersect with the direction of the second gradient pulse.

11. An MR system as claimed in claim 8, wherein said control unit is configured to operate the gradient system of the MR data acquisition unit to activate the first, second and third gradient pulses with respective directions of any two of said first, second and third gradient pulses being identical and orthogonal to the direction of another of the first, second and third gradient pulses.

12. An MR system as claimed in claim 8, wherein said control unit is configured to operate said RF radiator of said MR data acquisition unit with said STEAM imaging sequence as a DW STEAM EPI sequence.

* * * * *